United States Patent
Wu et al.

(10) Patent No.: US 10,637,354 B1
(45) Date of Patent: Apr. 28, 2020

(54) MULTI-CHANNEL POWER SYSTEM AND METHOD OF CONTROLLING PHASE SHIFT OF THE SAME

(71) Applicant: ANPEC ELECTRONICS CORPORATION, Hsinchu (TW)

(72) Inventors: Tse-Hsu Wu, Hsinchu (TW); Yun-Chiang Chang, Hsinchu (TW); Fu-Chuan Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 16/360,119

(22) Filed: Mar. 21, 2019

(30) Foreign Application Priority Data

Jan. 23, 2019 (TW) .............................. 108102471 A

(51) Int. Cl.
| | |
|---|---|
| *H02M 1/00* | (2006.01) |
| *H02M 1/08* | (2006.01) |
| *H02M 3/158* | (2006.01) |
| *H03K 7/08* | (2006.01) |

(52) U.S. Cl.
CPC ............. *H02M 3/158* (2013.01); *H02M 1/00* (2013.01); *H03K 7/08* (2013.01); *H02M 2001/0077* (2013.01); *H02M 2003/1586* (2013.01)

(58) Field of Classification Search
CPC .................. H02M 3/158; H02M 1/00; H02M 2003/1586; H02M 2001/0077; H03K 7/08
See application file for complete search history.

(56) References Cited

U.S. PATENT DOCUMENTS

| | | | | |
|---|---|---|---|---|
| 6,819,577 | B1 * | 11/2004 | Wiktor .................... | H02J 1/102 363/72 |
| 9,912,240 | B1 * | 3/2018 | Nguyen ................... | H02M 1/36 |
| 10,256,727 | B2 * | 4/2019 | Tao ......................... | H02M 3/1584 |
| 10,270,343 | B2 * | 4/2019 | Nguyen .................. | H02M 3/1584 |

FOREIGN PATENT DOCUMENTS

TW             201138314 A        11/2011

\* cited by examiner

*Primary Examiner* — Kenneth B Wells
(74) *Attorney, Agent, or Firm* — Li & Cai Intellectual Property (USA) Office

(57) ABSTRACT

A multi-channel power system and a method of controlling a phase shift of the same are provided. The multi-channel power system includes one or more first DC to DC converters and one or more second DC to DC converters. The first DC-DC converter outputs a first pulse width modulated signal having a first default frequency. When the first DC-DC converter receives a reference clock signal, it outputs the first pulse width modulated signal having a frequency that is the same as that of the reference clock signal. The first DC-DC converter outputs a phase-shifted clock signal having a preset phase shift relative to the first pulse width modulated signal. The second DC-DC converter outputs a second pulse width modulated signal having a second default frequency. The second DC-DC converter outputs the second pulse width modulated signal having the preset phase shift according to the phase shift clock signal.

10 Claims, 10 Drawing Sheets

MULTI-CHANNEL POWER SYSTEM AND METHOD OF CONTROLLING PHASE SHIFT OF THE SAME

CROSS-REFERENCE TO RELATED PATENT APPLICATION

This application claims the benefit of priority to Taiwan Patent Application No. 108102471, filed on Jan. 23, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a multi-channel power system, and more particularly to a multi-channel power system and a method of controlling a phase shift of the multi-channel power system.

BACKGROUND OF THE DISCLOSURE

A power converter is often configured to supply power required for operations of various internal electronic components of an electronic device such as a computer. The power converter is an important power supply source in addition to built-in batteries in the electronic device. A maximum power that the computer may consume needs to be considered during a process of designing the power converter. A power converter that is properly designed to be capable of supplying the maximum power can ensure that the computer can work normally under any circumstances.

However, the higher operating frequencies of a central processing unit and other various circuit components of the computer, the more power is consumed by the circuit components. Therefore, the power converter needs to supply very high power within the same time period. As a result, the power converter may supply an excessive current, resulting in high decibel noise generated by the power converter.

SUMMARY OF THE DISCLOSURE

In response to the above-referenced technical inadequacies, the present disclosure provides a multi-channel power system, which includes one or more first DC-DC converters and one or more second DC-DC converters. Each of the one or more first DC-DC converters is configured to output a first pulse width modulated signal having a first default frequency preset by each of the first DC-DC converters before receiving a reference clock signal from an external clock circuit. Each of the one or more first DC-DC converters is configured to calibrate the first default frequency of the first pulse width modulated signal to obtain the first pulse width modulated signal having a frequency that is the same as that of the reference clock signal when receiving the reference clock signal from the external clock circuit. At least one of the first DC-DC converters is configured to output one or more phase-shifted clock signals according to the first pulse width modulated signal. Each of the one or more second DC-DC converters is connected to one of the first DC-DC converters. Each of the one or more second DC-DC converters is configured to output a second pulse width modulated signal having a second default frequency preset by each of the second DC-DC converters before receiving the phase-shifted clock signal from the first DC-DC converter. Each of the one or more second DC-DC converters is configured to output the second pulse width modulated signal having a preset phase shift relative to the first pulse width modulated signal according to the phase-shifted clock signal when receiving the phase-shifted clock signal.

In addition, the present disclosure provides a method of controlling a phase shift of a multi-channel power system, which includes the following steps: configuring one or more first DC-DC converters, and one or more second DC-DC converters each connected to one of the first DC-DC converters; outputting, by each of the first DC-DC converters, a first pulse width modulated signal having a first default frequency preset by each of the first DC-DC converters; outputting, by each of the second DC-DC converters, a second pulse width modulated signal having a second default frequency preset by each of the second DC-DC converters; receiving, by each of the first DC-DC converters, a reference clock signal from an external clock circuit; calibrating, by each of the first DC-DC converters, the first default frequency of the first pulse width modulated signal to obtain the first pulse width modulated signal having a frequency that is the same as that of the reference clock signal according to the reference clock signal; outputting, by the first DC-DC converter, one or more phase-shifted clock signals according to the first pulse width modulated signal; and outputting, by each of the second DC-DC converters, the second pulse width modulated signal having a preset phase shift relative to the first pulse width modulated signal according to the phase-shifted clock signal.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
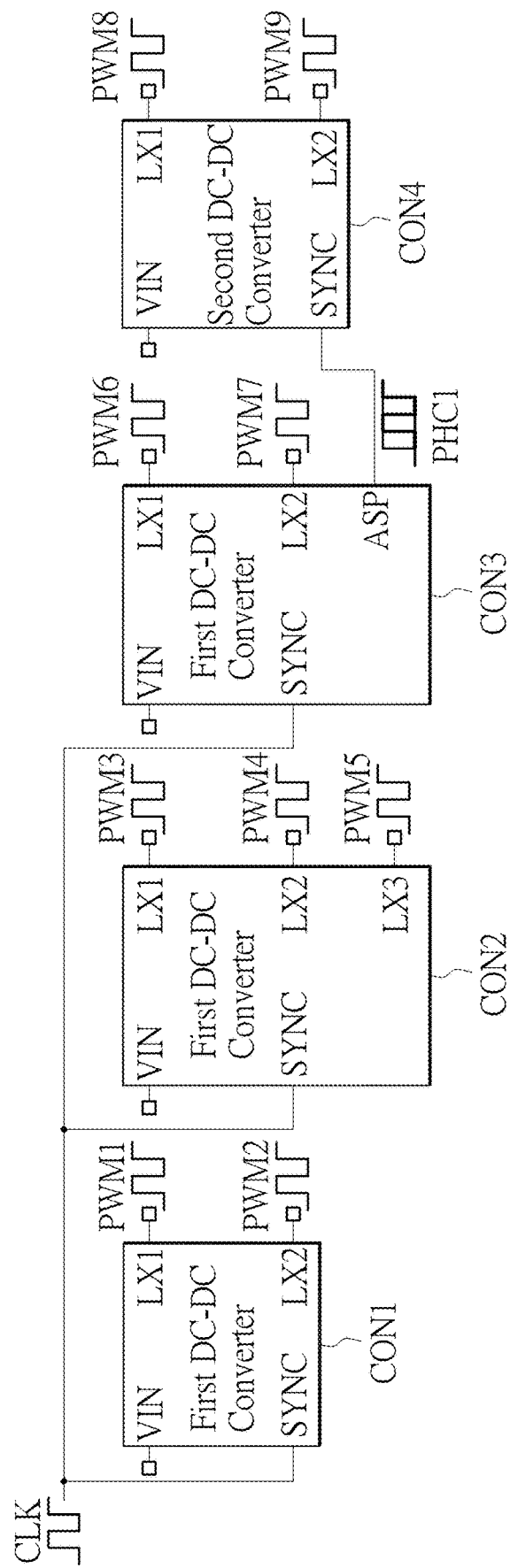
FIG. 1 is a block diagram of a multi-channel power system according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a block diagram of a multi-channel power system according to a first embodiment of the present disclosure. As shown in FIG. 1, the multi-channel power system includes a plurality of first DC-DC converters such as three first DC-DC converters CON1 to CON3 and one second DC-DC converter CON4. It should be understood that the number and configurations of the DC-DC converters included in the multi-channel power system are merely illustrative, and the present disclosure is not limited thereto.

Each of the DC-DC converters CON1 to CON4 may have an input pin VIN and receive DC power from an external power supply circuit such as a transformer, a battery, an external universal serial bus (USB) or the like through the input pin VIN.

In addition, each of the DC-DC converters CON1 to CON4 may have an input pin SYNC. The first DC-DC converters CON1 to CON3 may synchronously receive the same reference clock signal from an external clock circuit through the input pins SYNC and be triggered to operate by the received reference clock signal. It is worth noting that the second DC-DC converter CON4 receives a phase-shifted clock signal PHC1 from the first DC-DC converter CON3 through the input pin SYNC, rather than the reference clock signal that is the same as that received by the first DC-DC converters CON1 to CON3. As a result, the second DC-DC converter CON4 outputs the second pulse width modulated signal having the same frequency but a different phase from the first pulse width modulated signal outputted by each of the first DC-DC converters CON1 to CON3.

Each of the DC-DC converters CON1 to CON4 may have one or more output pins and outputs the pulse width modulated signal through the output pin. For example, the first DC-DC converter CON1 has two output pins LX1 and LX2, and outputs pulse width modulated signals PWM1 and PWM2 respectively through the output pins LX1 and LX2. The pulse width modulated signals PWM1 and PWM2 are outputted sequentially or simultaneously. The first DC-DC converter CON2 has three output pins LX1, LX2 and LX3, and outputs pulse width modulated signals PWM3, PWM4 and PWM5 respectively through the output pins LX1, LX2 and LX3. The pulse width modulated signals PWM3, PWM4 and PWM5 are outputted sequentially or simultaneously. The first DC-DC converter CON3 has two output pins LX1 and LX2, and outputs pulse width modulated signals PWM6 and PWM7 respectively through the output pins LX1 and LX2. The pulse width modulated signals PWM6 and PWM7 are outputted sequentially or simultaneously.

It is worth noting that the first DC-DC converter CON3 may further include an output terminal ASP connected to the input pin SYNC of the second DC-DC converter CON4. The first DC-DC converter CON3 may output the phase-shifted clock signal PHC1 through the output terminal ASP to the second DC-DC converter CON4 for operation. For example, the first DC-DC converter CON3 controls the second DC-DC converter CON4 to output pulse width modulated signals PWM8 and PWM9.

More specifically, the first DC-DC converters CON1 to CON3 may have the same or different first default frequencies. The first DC-DC converters CON1 to CON3 may output the pulse width modulated signals PWM1 to PWM7 each having the first default frequency before receiving the same reference clock signal CLK from the external clock circuit.

The second DC-DC converter CON4 may output the pulse width modulated signal PWM8 or PWM9 having a second default frequency preset by the second DC-DC converter CON4 before receiving phase-shifted clock signal PHC1 from the first DC-DC converter CON3.

Conversely, when the first DC-DC converter CON1 receives the reference clock signal CLK from the external clock circuit, the first DC-DC converter CON1 calibrates the pulse width modulated signal PWM1 or PWM2 having the first default frequency to obtain the pulse width modulated signal PWM1 or PWM2 having a frequency that is the same as that of the reference clock signal CLK.

Similarly, when the first DC-DC converter CON2 receives the reference clock signal CLK from the external clock circuit, the first DC-DC converter CON2 calibrates the pulse width modulated signal PWM3, PWM4 or PWM5 having the default frequency preset by the first DC-DC converter CON2 to obtain the pulse width modulated signal PWM3, PWM4 or PWM5 having the frequency that is the same as that of the reference clock signal CLK.

Similarly, when the first DC-DC converter CON3 receives the reference clock signal CLK from the external clock circuit, the first DC-DC converter CON3 calibrates the pulse width modulated signal PWM6 or PWM7 having the default frequency preset by the first DC-DC converter CON3 to obtain the pulse width modulated signal PWM6 or PWM7 having the frequency that is the same as that of the reference clock signal CLK.

Figure 2:
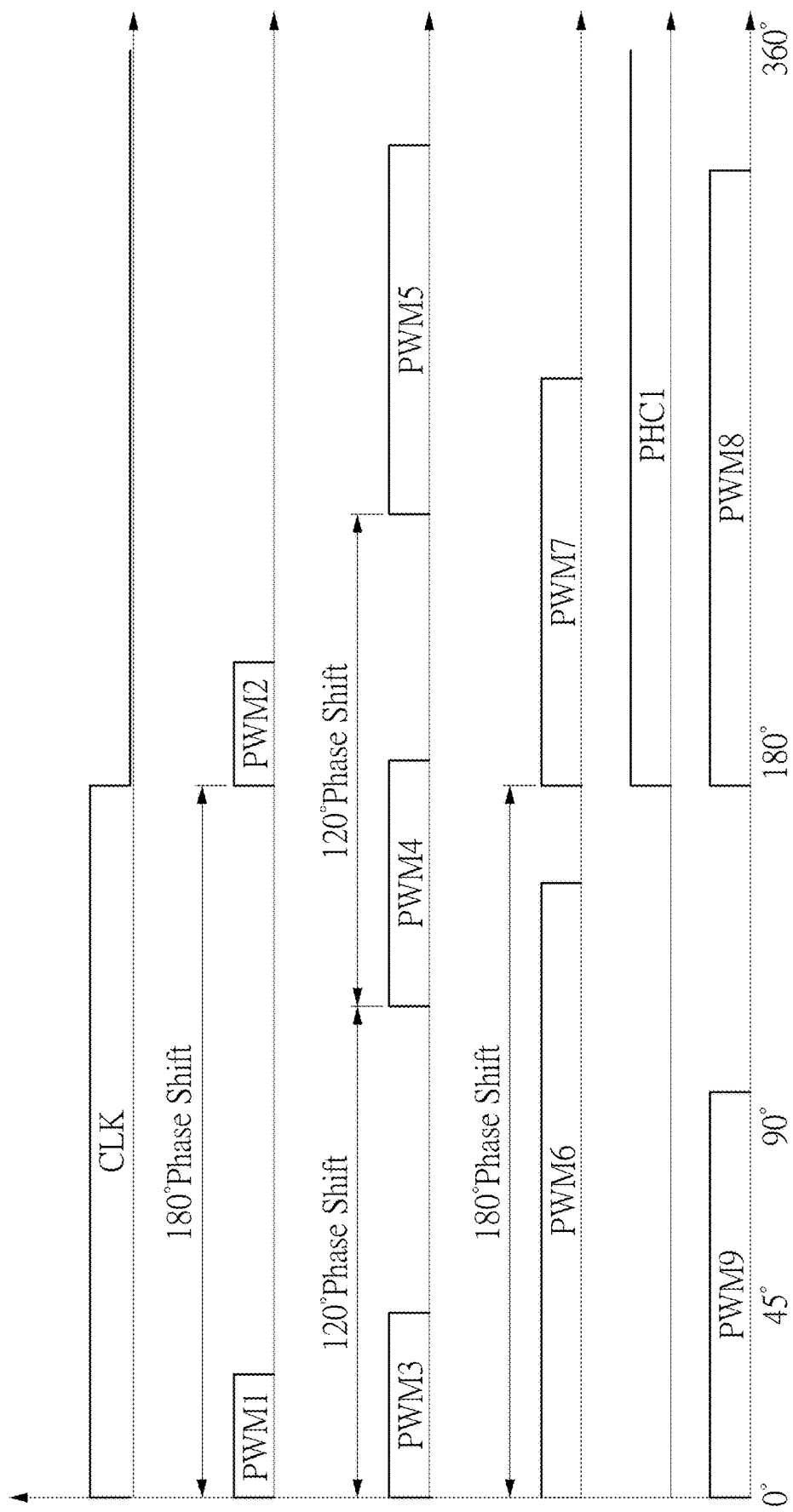
FIG. 2 is a waveform diagram of the multi-channel power system according to the first embodiment of the present disclosure.

Reference is further made to FIG. 2, which is a waveform diagram of the multi-channel power system according to the first embodiment of the present disclosure. As shown in FIG. 2, when the first DC-DC converters CON1 to CON3 synchronously receive the same reference clock signal CLK, the first DC-DC converters CON1 to CON3 respectively output the pulse width modulated signals PWM1, PWM3 and PWM6 having different pulse widths at the same time. A pulse width of the pulse width modulated signal PWM6 is larger than a pulse width of each of the pulse width modulated signals PWM1 and PWM2. Alternatively, the first DC-DC converters CON1 to CON3 may output the pulse width modulated signals PWM1, PWM3 and PWM6 having the same pulse width.

It is worth noting that, as shown in FIG. 2, in the embodiment, the second DC-DC converter CON4 outputs the pulse width modulated signal PWM8 having a pulse width that is the same as that of the pulse width modulated signal PWM6 outputted by the first DC-DC converter CON3. For example, the pulse width of each of the pulse width modulated signal PWM6 and PWM8 is larger than a pulse width threshold. For example, the pulse width modulated signals PWM6 and PWM8 are used to supply a power larger than a power threshold, such as a voltage of 5 volts and a current of 4 amps, but the present disclosure is not limited thereto. It should be understood that the supplied power may depend on different power consumption of different circuit components or devices of the applied power system.

The second DC-DC converter CON4 receives the phase-shifted clock signal PHC1 from the first DC-DC converter CON3, rather than receiving the reference clock signal CLK from the external clock circuit. The second DC-DC converter CON4 outputs the pulse width modulated signal PWM8 or PWM9 having a preset phase shift relative to the pulse width modulated signal PWM6 or PWM7 according to the phase-shifted clock signal PHC1. A frequency of the pulse width modulated signal PWM8 or PWM9 outputted by the second DC-DC converter CON4 may be the same as the frequency of the pulse width modulated signal PWM6 or PWM7 outputted by the first DC-DC converter CON3.

The second DC-DC converter CON4 outputs the pulse width modulated signal PWM8 during a time period that does not overlap with another time period during which the first DC-DC converter CON3 outputs the pulse width modulated signal PWM 6, according to the phase shift clock signal PHC1 having the preset phase shift relative to the pulse width modulated signal PWM6. As shown in FIG. 2, two pulses of the pulse width modulated signals PWM6 and PWM8 are shifted from each other without overlapping each other on the same time axis. As a result, a high current or a high voltage is not supplied during the same time period or at the same time point such that electromagnetic interference (EMI) will not be generated in the multi-channel power system.

As shown in FIG. 2, when the reference clock signal CLK received by each of the first DC-DC converters CON1 to CON3 reaches a reference level such as a high level, the first DC-DC converters CON1 to CON3 respectively output the pulse width modulated signals PWM1, PWM3 and PWM6 at the same time. When the phase-shifted clock signal PHC1 received by the second DC-DC converter CON4 reaches the reference level such as the high level, the second DC-DC converter CON4 outputs the pulse width modulated signal PWM8.

Further, after the first pulse width modulated signals PWM1, PWM3 and PWM6 are outputted, each of the DC-DC converters CON1 to CON3 may be set to output other pulse width modulated signals through other output pins during different time periods. For example, the pulse width modulated signal PWM2 outputted by the DC-DC converter CON1 has a phase shift of 180 degrees relative to the pulse width modulated signal PWM1. The pulse width modulated signal PWM4 outputted by the DC-DC converter CON2 has a phase shift of 120 degrees relative to the pulse width modulated signal PWM3.

Figure 3:
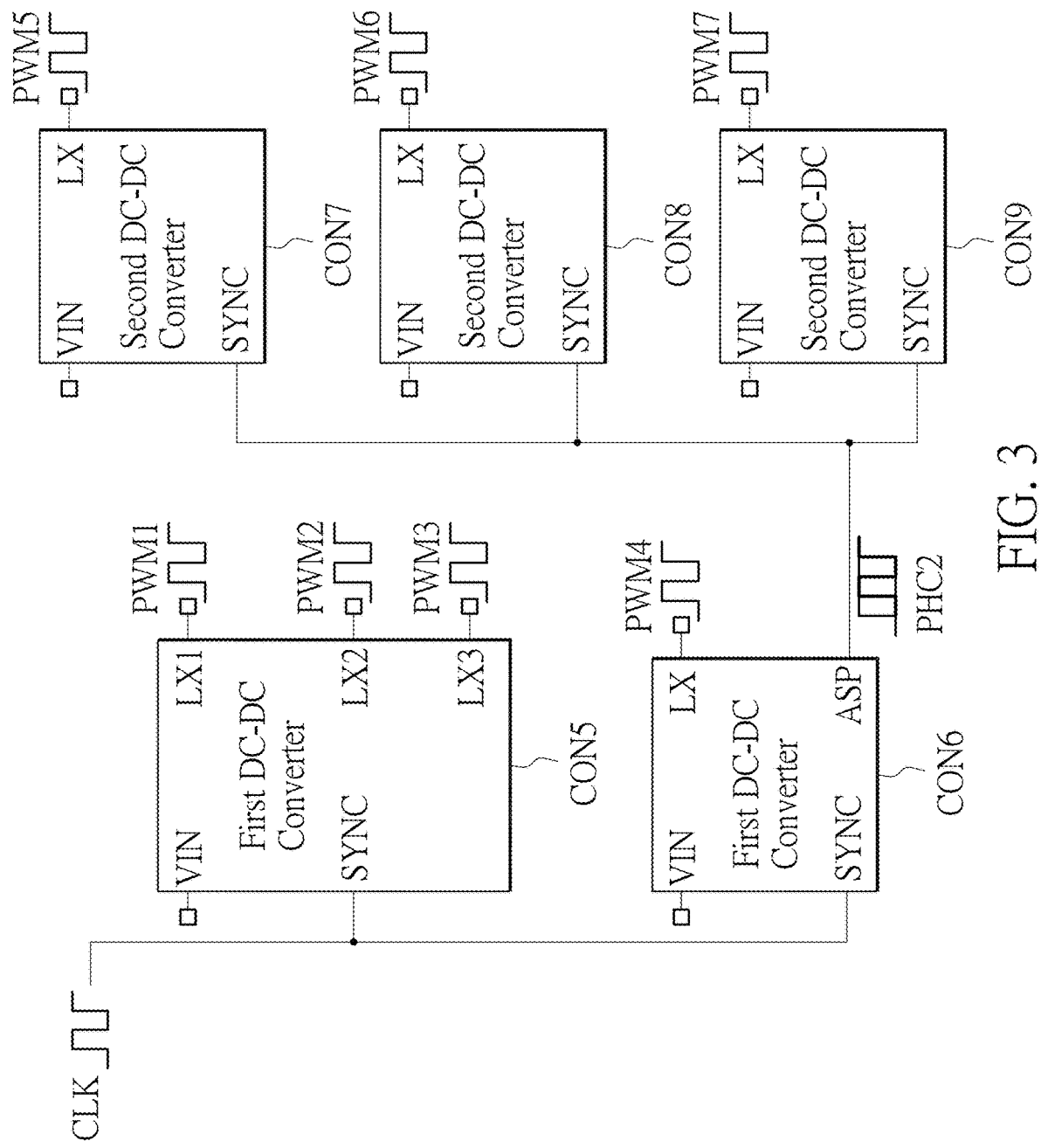
FIG. 3 is a block diagram of a multi-channel power system according to a second embodiment of the present disclosure.
Figure 4:
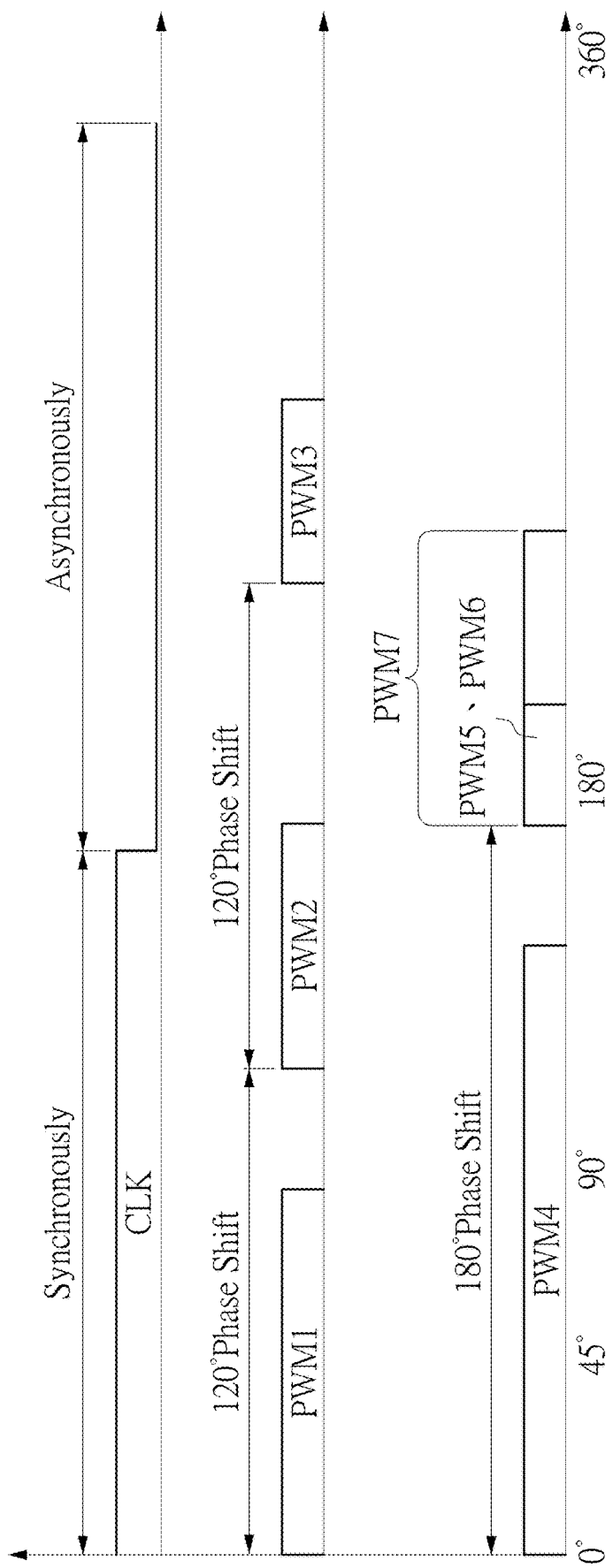
FIG. 4 is a waveform diagram of the multi-channel power system according to the second embodiment of the present disclosure.

Reference is made to FIGS. 3 and 4, which are respectively a block diagram and a waveform diagram of a multi-channel power system according to a second embodiment of the present disclosure. As shown in FIG. 3, the multi-channel power system includes a plurality of first DC-DC converters such as two first DC-DC converters CON5 and CON6 and a plurality of second DC-DC converters such as three second DC-DC converters CON7 to CON9. The second DC-DC converters CON7 to CON9 are connected to the first DC-DC converter CON6.

As shown in FIG. 3, the first DC-DC converters CON5 and CON6 synchronously receive the reference clock signals CLK from the external clock circuit. As shown in FIG. 3, the first DC-DC converters CON5 and CON6 respectively output the pulse width modulated signals PWM1 and PWM4 that have different pulse widths from each other at the same time.

On the other hand, the first DC-DC converter CON6 determines the phase shift clock signal PHC2 to be outputted to the second DC-DC converters CON7 to CON9, according to a time point at which the first DC-DC converter CON6 outputs the pulse width modulated signal PWM4 and the pulse width of the pulse width modulated signal PWM4.

As shown in FIG. 4, the second DC-DC converters CON7 to CON9 respectively output the pulse width modulated signals PWM5 to PWM7 each having the preset phase shift such as 180 degrees relative to the pulse width modulated signal PWM4 outputted by the first DC-DC converter CON6, according to the phase shift clock signal PHC2. In this way, the multi-channel power system does not supply excessive power during the same time period to prevent from generating electromagnetic interference.

Figure 5:
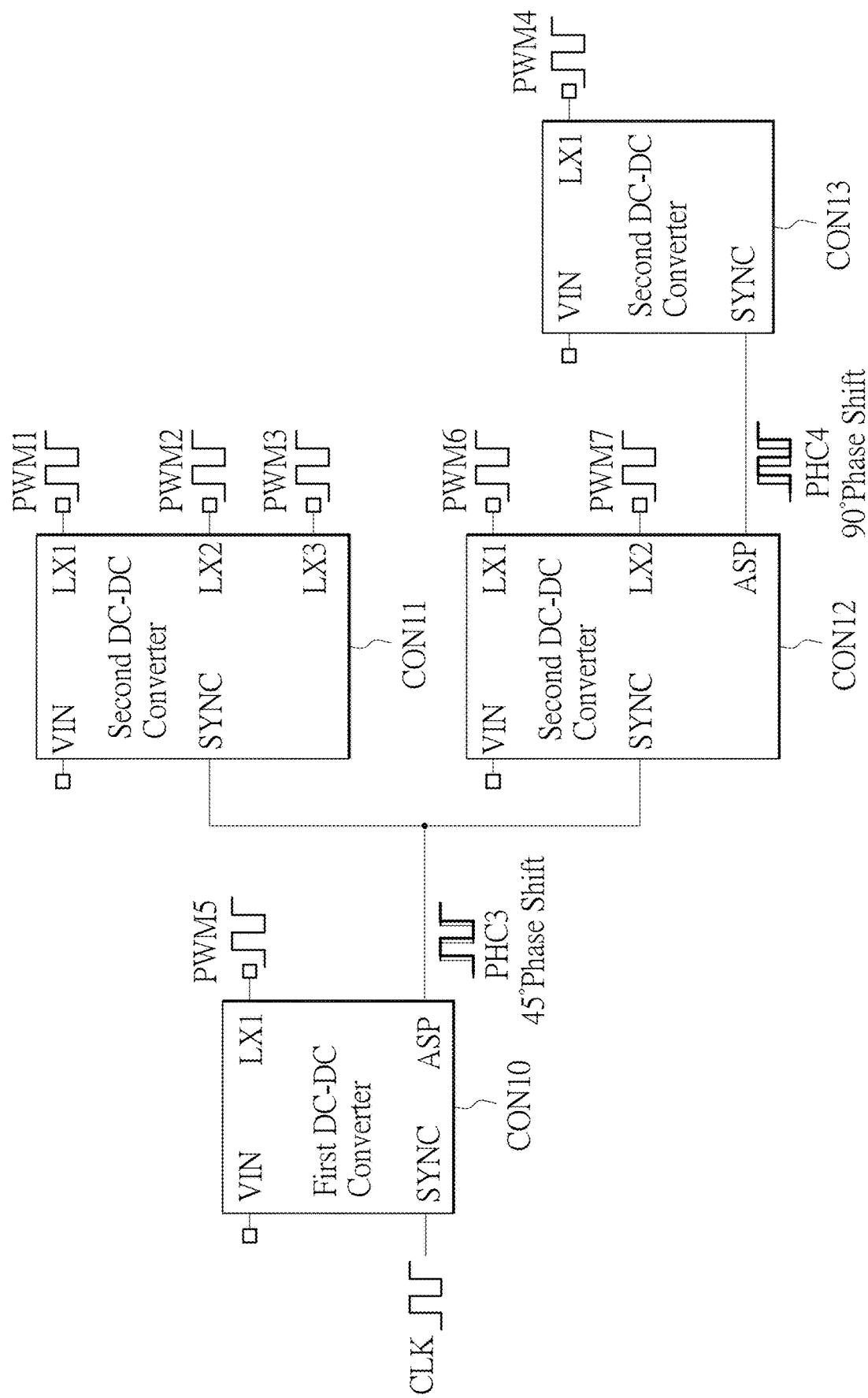
FIG. 5 is a block diagram of a multi-channel power system according to a third embodiment of the present disclosure.
Figure 6:
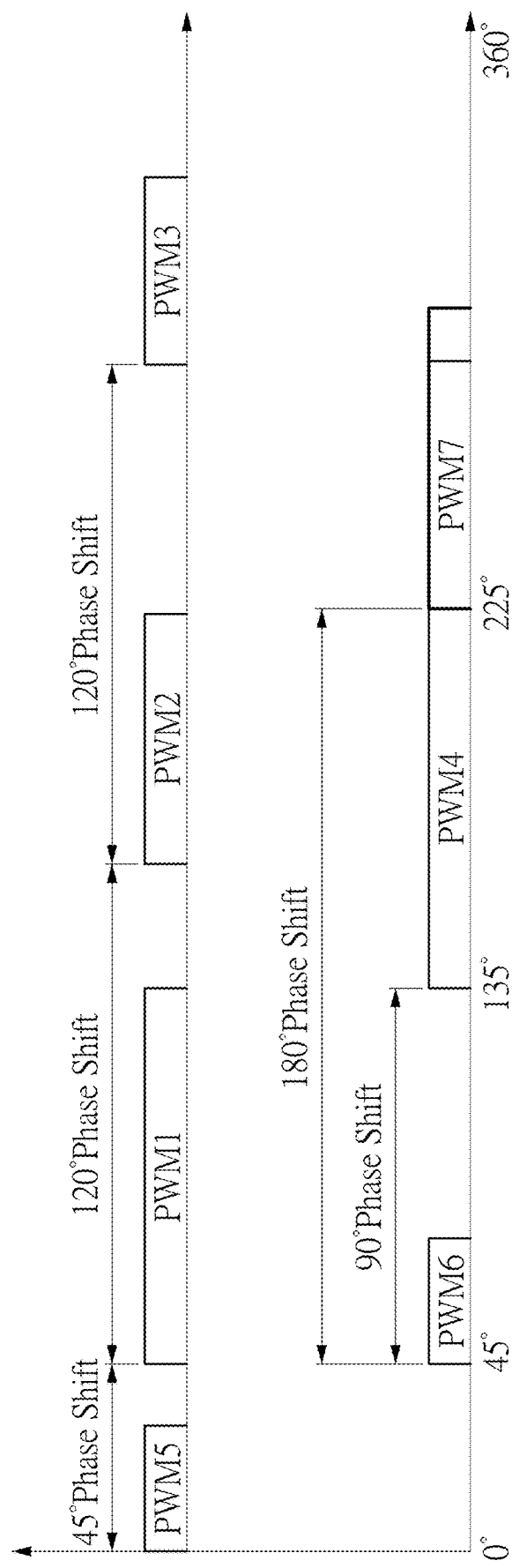
FIG. 6 is a waveform diagram of the multi-channel power system according to the third embodiment of the present disclosure.

Reference is made to FIGS. 5 and 6, which are respectively a block diagram and a waveform diagram of a multi-channel power system according to a third embodiment of the present disclosure. As shown in FIG. 5, the multi-channel power system includes a first DC-DC converter CON10 and a plurality of DC-DC converters such as three second DC-DC converters CON11 to CON13. The DC-DC converter CON10 is connected to the DC-DC converters CON11 and CON12. The DC-DC converter CON12 is connected to the DC-DC converter CON13.

The DC-DC converter CON10 outputs a pulse width modulated signal PWM5 having a default frequency preset by the DC-DC converter CON10 before the DC-DC converter CON10 receives the clock signal CLK from the external clock circuit. When the DC-DC converter CON10 receives the clock signal CLK from the external clock circuit and the clock signal CLK reaches the reference level such as the high level, the DC-DC converter CON10 outputs the pulse width modulated signal PWM5 having a frequency that is the same as that of the clock signal CLK.

Further, the DC-DC converter CON10 outputs a phase-shifted clock signal PHC3 having a preset phase shift of, for example, 45 degrees relative to the pulse width modulated signal PWM5 to the DC-DC converters CON11 and CON12. As shown in FIG. 6, the DC-DC converters CON11 and CON12 respectively output the pulse width modulated signals PWM1 and PWM6 each having the preset phase shift of, for example, 45 degrees relative to the pulse width modulated signal PWM1 according to the phase shift clock signal PHC3. Further, as shown in FIG. 5, the DC-DC converter CON12 outputs a phase-shifted clock signal PHC4 having a phase shift of, for example, 90 degrees relative to the pulse width modulated signal PWM6 to the DC-DC converter CON13. As shown in FIG. 6, the DC-DC converter CON13 outputs a pulse width modulated signal PWM4 having the preset phase shift of, for example, 90 degrees relative to the pulse width modulated signal PWM6 according to the phase shift clock signal PHC4.

Alternatively, the DC-DC converter CON10 is connected to the DC-DC converter CON13 and outputs a phase-shifted clock signal PHC3 having a preset phase shift of, for example, 135 degrees relative to the pulse width modulated signal PWM5 to the DC-DC converter CON13. In this way, the DC-DC converter CON13 outputs the pulse width modulated signal PWM4 having the phase shift of, for example, 90 degrees relative to the pulse width modulated signal PWM6.

Figure 7:
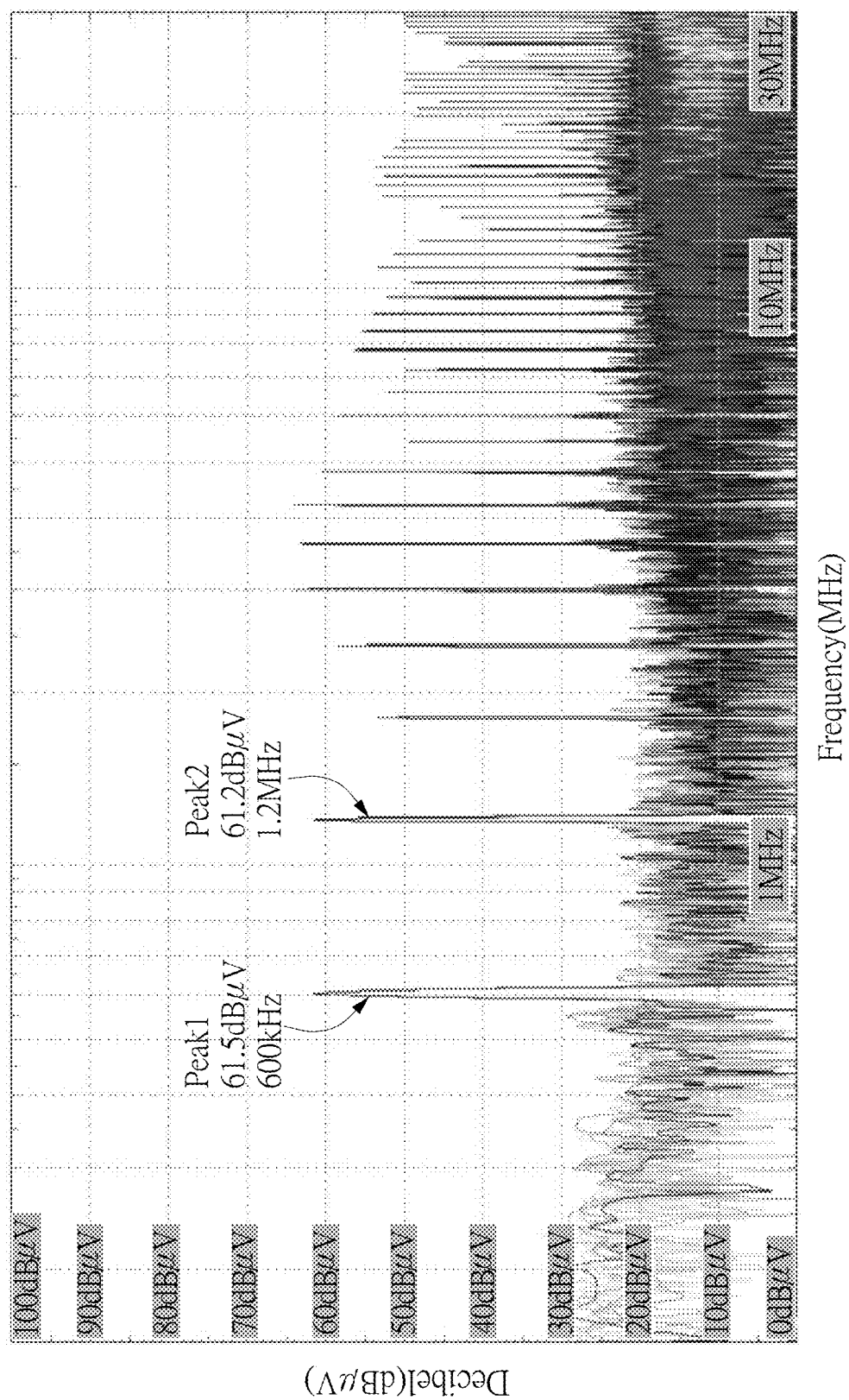
FIG. 7 is a noise spectrum test diagram of the multi-channel power system according to the third embodiment of the present disclosure.

Reference is further made to FIG. 7, which is a noise spectrum test diagram of the multi-channel power system according to the third embodiment of the present disclosure. As shown in FIG. 7, the DC-DC converters CON10, CON12 and CON13 respectively supply the pulse width modulated signals PWM5, PWM6 and PWM4 during different time periods. As a result, a maximum decibel of noise produced by the multi-channel power system reaches only 61.5 dbuV, which is lower than a decibel threshold such as 70 dbuV, but the present disclosure is not limited thereto. It should be understood that the multi-channel power system can supply lower power during different time periods by presetting a phase shift different from the above preset phase such that the maximum decibel of the produced noise decibel can be further reduced.

Figure 8:
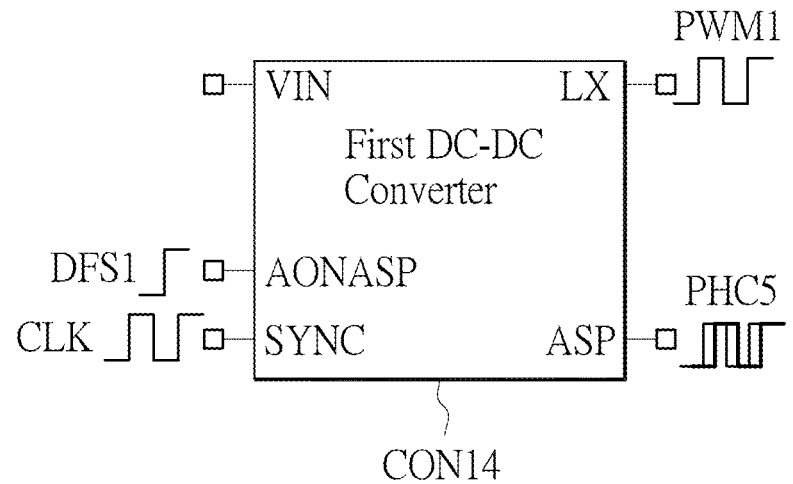
FIG. 8 is a block diagram of a first DC-DC converter of a multi-channel power system according to a fourth embodiment of the present disclosure.

Reference is made to FIG. 8, which is a block diagram of a first DC-DC converter of a multi-channel power system according to a fourth embodiment of the present disclosure. As shown in FIG. 8, the first DC-DC converter CON14 of the multi-channel power system has input pins VIN, AONASP and SYNC, and output pins LX and ASP.

The DC-DC converter CON14 may receive a default frequency trigger signal DF S1 from an external trigger circuit through the input pin AONASP. The DC-DC converter CON14 may receive the reference clock signal CLK from the external clock circuit through the input pin SYNC.

When the first DC-DC converter CON14 receives the default frequency trigger signal DFS1 having a waveform reaching the reference level such as the high level, but does not receive the reference clock signal CLK, the first DC-DC converter CON14 outputs a phase-shifted clock signal PHC5 having a first default frequency preset by the first DC-DC converter CON14 and a preset phase shift relative to the pulse width modulated signal PWM1.

When the first DC-DC converter CON14 receives the default frequency trigger signal DFS1 having a waveform that is maintained at or reaches the high level from a low level and receives the reference clock signal CLK, the first DC-DC converter CON14 may output the phase-shifted clock signal PHC5 having a frequency that is the same as that of the reference clock signal CLK to a second DC-DC converter.

Conversely, when the first DC-DC converter CON14 receives the default frequency trigger signal DFS1 having a waveform that does not reach the reference level, for example, the waveform is maintained at the low level or receives the low level from the high level, but does not receive the reference clock signal CLK, the first DC-DC converter CON14 does not output any phase-shifted clock signal to the second DC-DC converter.

When the first DC-DC converter CON14 receives the default frequency trigger signal DF S1 having a waveform that does not reach the reference level and receives the reference clock signal CLK, the first DC-DC converter CON14 outputs the phase-shifted clock signal PHC5 having the frequency that is the same as that of the reference clock signal CLK and the preset phase shift relative to the pulse width modulated signal PWM1.

Figure 9:
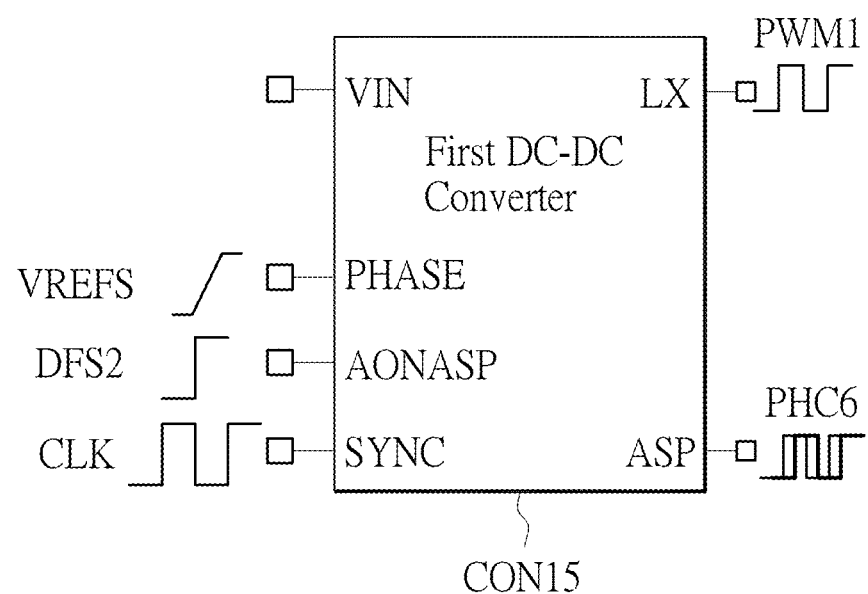
FIG. 9 is a block diagram of a first DC-DC converter of a multi-channel power system according to a fifth embodiment of the present disclosure.

Reference is made to FIG. 9, which is a block diagram of a first DC-DC converter of a multi-channel power system according to a fifth embodiment of the present disclosure. As shown in FIG. 9, the first DC-DC converter CON15 of the multi-channel power system has input pins VIN, AONASP and SYNC, and output pins LX and ASP. A difference between the first DC-DC converter CON15 of the fifth embodiment and the first DC-DC converter CON14 of the fourth embodiment is that, the first DC-DC converter CON15 further has an input pin PHASSE, as described in detail below.

The first DC-DC converter CON15 receives a reference phase shift signal VREF from an external phase circuit such as a microprocessor or a main controller through the input pin PHASE. The first DC-DC converter CON15 outputs a phase-shifted clock signal PHC6 having a phase that is the same as that of the reference phase shift signal VREF through the output pin ASP, according to the reference phase shift signal VREF. The phase shift clock signal PHC6 has a reference phase shift relative to the pulse width modulated signal PWM1 outputted by the first DC-DC converter CON15.

Therefore, the second DC-DC converter receiving the phase-shifted clock signal PHC6 from the first DC-DC converter CON15 may output a second pulse width modulated signal PWM1 during a time period that does not overlap with another time period during which the first DC-DC converter CON15 outputs the pulse width modulated signal PWM1. Therefore, the noise generated by the operations of the multi-channel power system can be effectively reduced.

Figure 10:
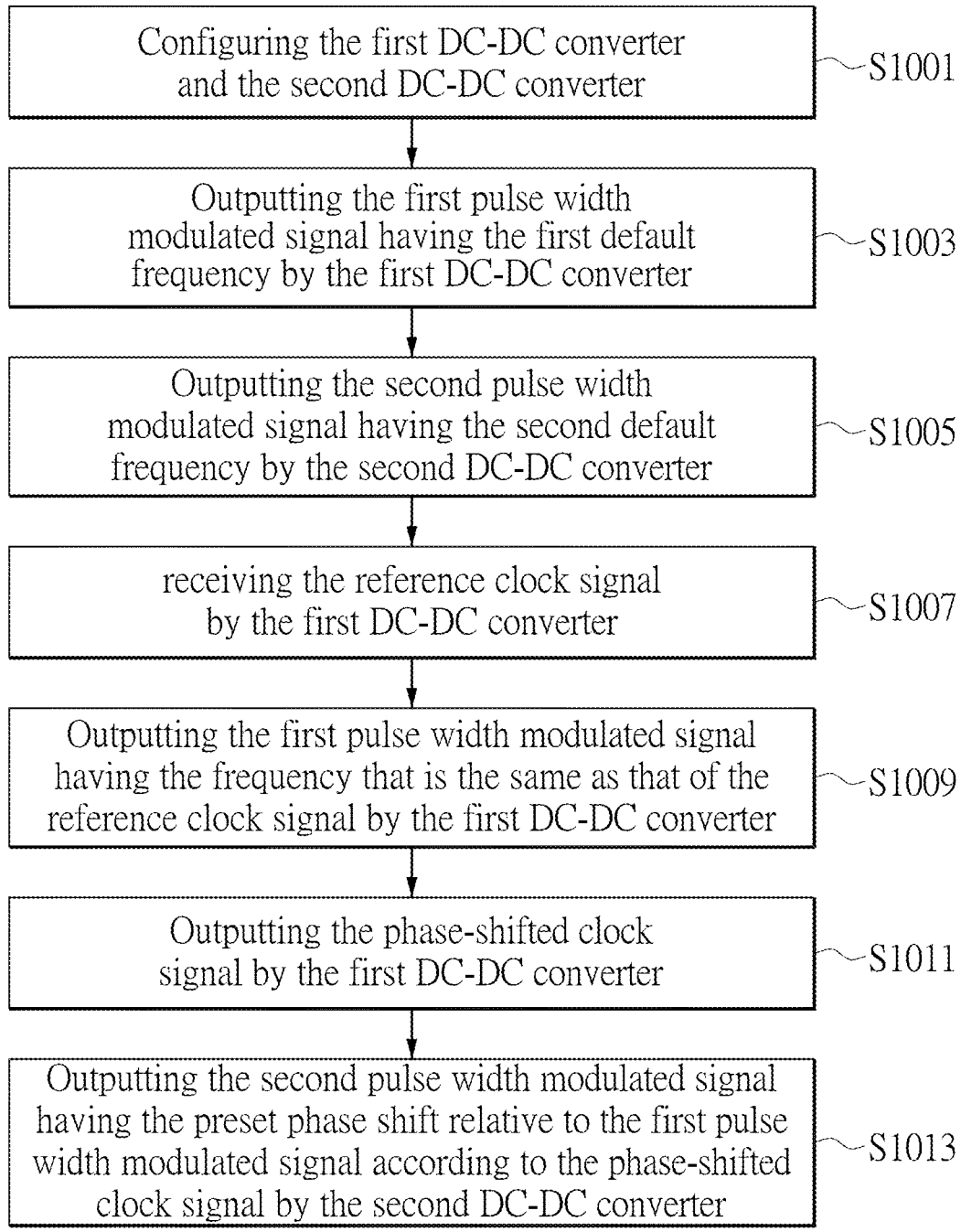
FIG. 10 is a flowchart diagram of a method of controlling a phase shift of a multi-channel power system according to a sixth embodiment of the present disclosure.

Reference is made to FIG. 10, which is a flowchart diagram of a method of controlling a phase shift of a multi-channel power system according to a sixth embodiment of the present disclosure. As shown in FIG. 10, the method of controlling the phase shift of the multi-channel power system of the sixth embodiment includes the following steps S1001 to S1013.

In step S1001, the one or more first DC-DC converters and the one or more second DC-DC converters are provided. Each of the second DC-DC converters is connected to one of the first DC-DC converters.

In step S1003, the first DC-DC converter outputs the first pulse width modulated signal having the first default frequency preset by the first DC-DC converter.

In step S1005, the second DC-DC converter outputs the second pulse width modulated signal having the second default frequency preset by the second DC-DC converter.

In step S1007, the first DC-DC converter receives the reference clock signal from the external clock circuit.

In step S1009, the first DC-DC converter calibrates the first default frequency of the first pulse width modulated signal to output the first pulse width modulated signal having the frequency that is the same as that of the reference clock signal according to the reference clock signal.

In step S1011, the first DC-DC converter outputs the phase-shifted clock signals each having the preset phase shift relative to the first pulse width modulated signal according to the first pulse width modulated signal.

In step S1013, the second DC-DC converter outputs the second pulse width modulated signal having the preset phase shift relative to the first pulse width modulated signal according to the phase-shifted clock signal.

Figure 11:
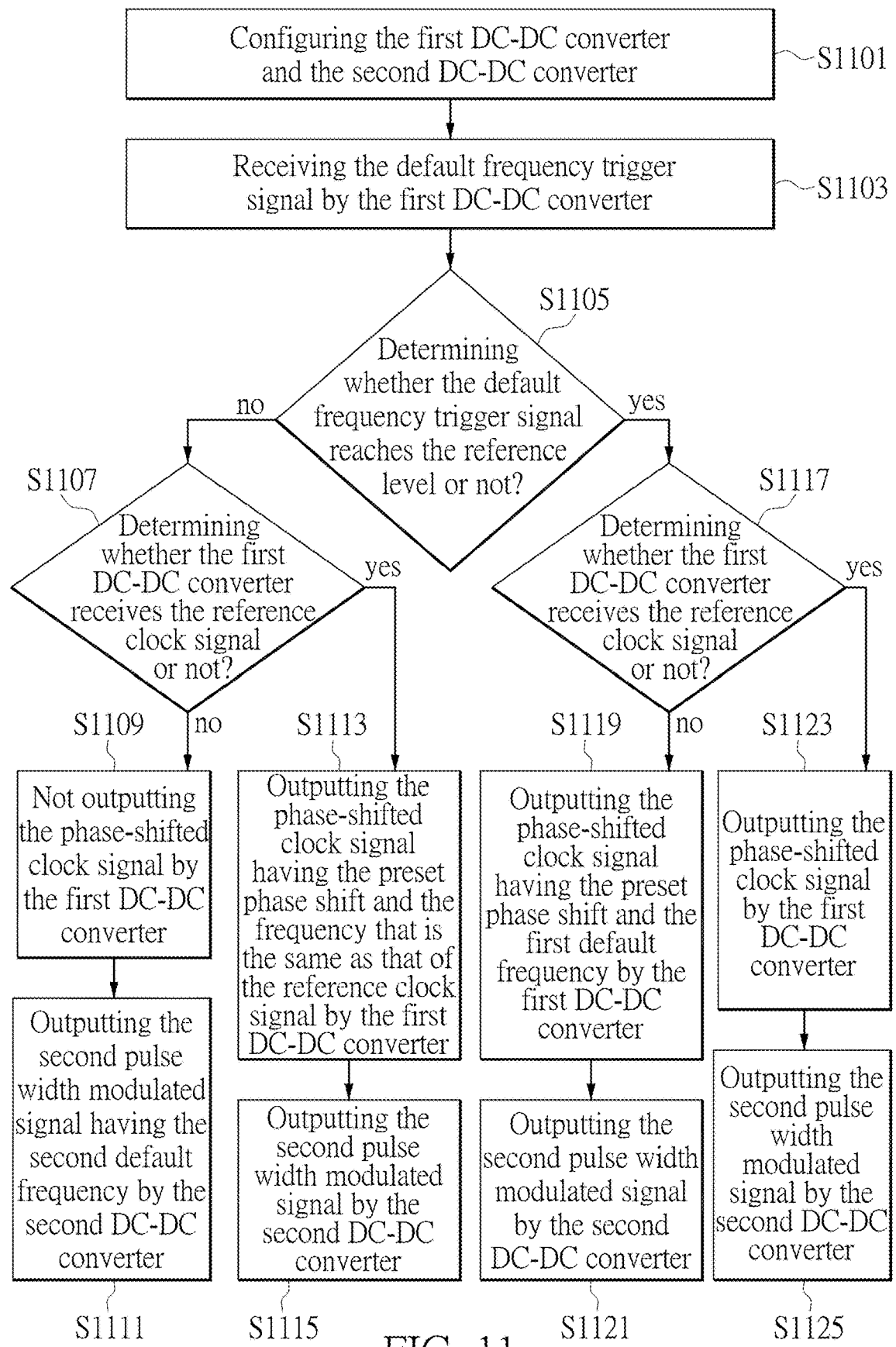
FIG. 11 is a flowchart diagram of a method of controlling a phase shift of a multi-channel power system according to a seventh embodiment of the present disclosure.

Reference is made to FIG. 11, which is a flowchart diagram of a method of controlling a phase shift of a multi-channel power system according to a seventh embodiment of the present disclosure. As shown in FIG. 11, the method of controlling the phase shift of the multi-channel power system of the seventh embodiment includes the following steps S1101 to S1125.

In step S1101, the first DC-DC converters and the second DC-DC converters are provided. Each of the second DC-DC converters is connected to one of the first DC-DC converters.

In step S1103, the first DC-DC converter receives the default frequency trigger signal.

In step S1105, it is determined whether or not the default frequency trigger signal reaches the reference level such as the high level. If the default frequency trigger signal does not reach the reference level, step S1107 is performed. Conversely, if the default frequency trigger signal reaches the reference level, step S1117 is performed.

In step S1107, it is determined whether or not the first DC-DC converter receives the reference clock signal. If the first DC-DC converter does not receive the reference clock signal, the first DC-DC converter outputs the first pulse width modulated signal having the first default frequency preset by the first DC-DC converter. Next, in step S1109, the first DC-DC converter does not output the phase-shifted clock signal. Therefore, in step S1111, the second DC-DC converter outputs the second pulse width modulated signal having the second default frequency preset by the second DC-DC converter.

Conversely, if the first DC-DC converter has received the reference clock signal, the first DC-DC converter outputs the first pulse width modulated signal having the frequency that is the same as that of the reference clock signal, and step S1113 is then performed. In step S113, the first DC-DC converter outputs the phase-shifted clock signals each having the preset phase shift relative to the first pulse width modulated signal and the frequency that is the same as that of the reference clock signal, and step S1115 is then performed.

In step S1115, the second DC-DC converter outputs the second pulse width modulated signal having the preset phase shift relative to the first pulse width modulated signal of the first DC-DC converter, according to the phase-shifted clock signal received from the first DC-DC converter.

In step S1117, it is determined whether or not the first DC-DC converter receives the reference clock signal. If the first DC-DC converter does not receive the reference clock signal, the first DC-DC converter outputs the first pulse width modulated signal having the first default frequency preset by the first DC-DC converter, step S1119 is then performed. Conversely, if the first DC-DC converter has received the reference clock signal, the first DC-DC converter outputs the first pulse width modulated signal having the frequency that is the same as that of the reference clock signal, and step S1123 is then performed.

In step S1119, the first DC-DC converter outputs the phase-shifted clock signals each having the preset phase shift relative to the first pulse width modulated signal and the first default frequency, and step S1121 is then performed.

In step S1121, the second DC-DC converter outputs the second pulse width modulated signal having the preset phase shift relative to the first pulse width modulated signal according to the phase-shifted clock signal.

In step S1123, the first DC-DC converter outputs the phase-shifted clock signals each having the preset phase shift relative to the first pulse width modulated signal and the frequency that is the same as that of the reference clock signal, and step S1125 is then performed.

In step S1125, the second DC-DC converter outputs the second pulse width modulated signal having the preset phase shift relative to the first pulse width modulated signal according to the phase-shifted clock signal In summary, the present disclosure provides the multi-channel power system and the method of controlling the phase shift of the multi-channel power system, which includes the DC-DC converters configured to sequentially provide the pulse width modulated signals, and in particular, that the pulse width modulated signals each have a large pulse width, during the different time periods. The pulse width modulated signals sequentially provided during the different time periods do not overlap with each other on the same time axis. Therefore, the multi-channel power system of the present disclosure does not supply the high current or the high voltage at the same time to prevent from generating the high-decibel electromagnetic interference.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A multi-channel power system, comprising:
a first DC-DC converter configured to output a first pulse width modulated signal having a first default frequency preset by the first DC-DC converter before receiving a reference clock signal from an external clock circuit, and calibrate the first default frequency of the first pulse width modulated signal to obtain the first pulse width modulated signal having a frequency that is the same as that of the reference clock signal when receiving the reference clock signal from the external clock circuit, wherein the first DC-DC converter is configured to output a phase-shifted clock signal according to the first pulse width modulated signal; and
a plurality of second DC-DC converters each connected to the first DC-DC converter, and configured to output a second pulse width modulated signal having a second default frequency preset by each of the second DC-DC converters before receiving the phase-shifted clock signal from the first DC-DC converter;

wherein one of the second DC-DC converters is configured to receive the phase-shifted clock signal from the first DC-DC converter, output a second pulse width modulated signal having a preset phase shift relative to the first pulse width modulated signal according to the phase-shifted clock signal outputted by the first DC-DC converter, and output a phase-shifted clock signal to another of the second DC-DC converters to trigger the another second DC-DC converter to output a second pulse width modulated signal having a preset phase shift relative to the second pulse width modulated signal outputted by the one second DC-DC converter;

wherein the preset phase shift of the second pulse width modulated signal outputted by the one second DC-DC converter is different from the preset phase shift of the second pulse width modulated signal outputted by the another second DC-DC converter; and wherein a pulse width of the second pulse width modulated signal outputted by the one second DC-DC converter is not equal to a pulse width of the second pulse width modulated signal outputted by the another second DC-DC converter.

2. The multi-channel power system of claim 1, wherein when the first DC-DC converter receives a default frequency trigger signal reaching a reference level from an external trigger circuit, but does not receive the reference clock signal, the first DC-DC converter outputs the phase-shifted clock signal having the preset phase shift relative to the first pulse width modulated signal and the first default frequency.

3. The multi-channel power system of claim 1, wherein when the first DC-DC converter receives a default frequency trigger signal reaching a reference level from an external trigger circuit and receives the reference clock signal, the first DC-DC converter outputs the phase-shifted clock signal having the preset phase shift relative to the first pulse width modulated signal and the frequency that is the same as that of the reference clock signal.

4. The multi-channel power system of claim 1, wherein when the first DC-DC converter receives a default frequency trigger signal that does not reach a reference level from an external trigger circuit, and does not receive the reference clock signal, the first DC-DC converter does not output the phase-shifted clock signal having the preset phase shift relative to the first pulse width modulated signal.

5. The multi-channel power system of claim 1, wherein when the first DC-DC converter receives a default frequency trigger signal that does not reach a reference level from an external trigger circuit and receives the reference clock signal, the first DC-DC converter outputs the phase-shifted clock signal having the preset phase shift relative to the first pulse width modulated signal and the frequency that is the same as that of the reference clock signal.

6. A method of controlling a phase shift of a multi-channel power system, comprising the following steps:

configuring a first DC-DC converter, and a plurality of second DC-DC converters each connected to the first DC-DC converter;

outputting a first pulse width modulated signal having a first default frequency preset by the first DC-DC converter from the first DC-DC converter;

outputting a second pulse width modulated signal having a second default frequency preset by each of the second DC-DC converters from each of the second DC-DC converters;

receiving a reference clock signal from an external clock circuit by the first DC-DC converter;

calibrating the first default frequency of the first pulse width modulated signal to obtain the first pulse width modulated signal having a frequency that is the same as that of the reference clock signal according to the reference clock signal by the first DC-DC converter;

outputting a phase-shifted clock signal according to the first pulse width modulated signal by the first DC-DC converter to one of the second DC-DC converters;

outputting a second pulse width modulated signal having a preset phase shift relative to the first pulse width modulated signal according to the phase-shifted clock signal of the one second DC-DC converter;

outputting a phase-shifted clock signal to another of the second DC-DC converters by the one second DC-DC converter to trigger the another second DC-DC converter to output a second pulse width modulated signal having a preset phase shift relative to the second pulse width modulated signal of the one second DC-DC converter; and wherein the preset phase shift of the second pulse width modulated signal outputted by the one second DC-DC converter is different from the preset phase shift of the second pulse width modulated signal outputted by the another second DC-DC converter; and wherein a pulse width of the second pulse width modulated signal outputted by the one second DC-DC converter is not equal to a pulse width of the second pulse width modulated signal outputted by the another second DC-DC converter.

7. The method of claim 6, further comprising a step of:

when the first DC-DC converter receives a default frequency trigger signal reaching a reference level from an external trigger circuit, but does not receive the reference clock signal, outputting the phase-shifted clock signal having the preset phase shift relative to the first pulse width modulated signal and the first default frequency by the first DC-DC converter.

8. The method of claim 6, further comprising a step of:

when the first DC-DC converter receives a default frequency trigger signal reaching a reference level from an external trigger circuit and receives the reference clock signal, outputting the phase-shifted clock signal having the preset phase shift relative to the first pulse width modulated signal and the frequency that is the same as that of the reference clock signal by the first DC-DC converter.

9. The method of claim 6, further comprising a step of:

when the first DC-DC converter receives a default frequency trigger signal that does not reach a reference level from an external trigger circuit, and does not receive the reference clock signal, not outputting the phase-shifted clock signal having the preset phase shift relative to the first pulse width modulated signal by the first DC-DC converter.

10. The method of claim 6, further comprising a step of:

when the first DC-DC converter receives a default frequency trigger signal that does not reach a reference level from an external trigger circuit and receives the reference clock signal, outputting the phase-shifted clock signal having the preset phase shift relative to the first pulse width modulated signal and the frequency that is the same as that of the reference clock signal by the first DC-DC converter.

* * * * *